United States Patent
Nakamura et al.

(10) Patent No.: US 9,876,482 B2
(45) Date of Patent: Jan. 23, 2018

(54) MATCHING UNIT AND MATCHING METHOD

(71) Applicant: Hitachi Kokusai Electric Inc., Tokyo (JP)

(72) Inventors: Manabu Nakamura, Tokyo (JP); Naoya Fujimoto, Tokyo (JP); Norikazu Kato, Tokyo (JP); Yoshiyuki Oshida, Tokyo (JP); Naoto Takahashi, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 54 days.

(21) Appl. No.: 15/116,598

(22) PCT Filed: Feb. 24, 2015

(86) PCT No.: PCT/JP2015/055197
§ 371 (c)(1),
(2) Date: Aug. 4, 2016

(87) PCT Pub. No.: WO2015/129678
PCT Pub. Date: Sep. 3, 2015

(65) Prior Publication Data
US 2016/0352302 A1 Dec. 1, 2016

(30) Foreign Application Priority Data
Feb. 28, 2014 (JP) .................. 2014-039276

(51) Int. Cl.
*H03H 7/40* (2006.01)
*H01P 5/18* (2006.01)
*H05H 1/46* (2006.01)
(52) U.S. Cl.
CPC .......... *H03H 7/40* (2013.01); *H01P 5/18* (2013.01); *H05H 2001/4682* (2013.01)

(58) Field of Classification Search
CPC ..... H03H 7/40; H01P 5/18; H05H 2001/4682
(Continued)

(56) References Cited

U.S. PATENT DOCUMENTS 5,195,045 A * 3/1993 Keane ............... H01J 37/32082
315/111.51
2007/0121267 A1 5/2007 Kotani et al.
(Continued)

FOREIGN PATENT DOCUMENTS

JP 2002-271160 A 9/2002
JP 2003-318689 A 11/2003
(Continued)

OTHER PUBLICATIONS

Korean Office Action dated Jul. 11, 2017, issued in corresponding Korean Patent Application No. 10-2016-7020861 and English translation thereof.
(Continued)

*Primary Examiner* — Stephen E Jones
*Assistant Examiner* — Scott S Outten
(74) *Attorney, Agent, or Firm* — Bacon & Thomas, PLLC (57) ABSTRACT

A matching unit includes a directional coupler for detecting a travelling wave and a reflected wave; a matching circuit including a first variable capacitance capacitor, a second variable capacitance capacitor and an inductance; and a control unit for controlling VC1 and VC2 of the first and the second variable capacitance capacitor by calculating a reflection coefficient based on the travelling wave and the reflected wave. When a distance between the calculated reflection coefficient and a circle described by a trace of the reflection coefficient which passes through a matching point on a Smith chart is greater than a predetermined value, the control unit changes VC2 of the second variable capacitance capacitor and the calculated reflection coefficient to make (Continued)

the distance within the predetermined value. When the distance becomes within the predetermined value, the control unit changes VC1 of the first variable capacitance capacitor and makes the calculated reflection coefficient smaller.

5 Claims, 7 Drawing Sheets

(58) Field of Classification Search
USPC .......................................... 333/2, 17.3, 32
See application file for complete search history.

(56) References Cited

U.S. PATENT DOCUMENTS

2008/0284537 A1  11/2008  Ikenouchi
2009/0066438 A1  3/2009  Kim et al.
2011/0063042 A1*  3/2011  Mendolia .................. H01P 5/04
                                                                  333/17.3
2012/0306367 A1*  12/2012  Kim .................. H01J 37/32091
                                                                  315/53

FOREIGN PATENT DOCUMENTS

| JP | 2006-139949 A | 6/2006 |
| JP | 2009-124687 A | 6/2009 |
| JP | 2010-041558 A | 2/2010 |
| JP | 2010-045664 A | 2/2010 |
| JP | 2011-124191 A | 6/2011 |
| JP | 2012-130061 A | 7/2012 |
| WO | 2005/057993 A1 | 6/2005 |
| WO | 2013/132591 A1 | 12/2013 |

OTHER PUBLICATIONS

International Search Report dated May 12, 2015.

* cited by examiner

MATCHING UNIT AND MATCHING METHOD

FIELD OF THE INVENTION

The present invention relates to a matching unit for matching an output of a high frequency power source and a load.

BACKGROUND OF THE INVENTION

A plasma processing apparatus is used in a semiconductor manufacturing process for performing etching or thin film formation. As for a power source of the plasma processing apparatus, a high frequency power source is used. In order to efficiently supply power from the high frequency power source to the plasma processing apparatus, it is required to match an impedance between the high frequency power source and the plasma processing apparatus (load). As for a device for matching an impedance, a matching unit is generally provided between the high frequency power source and the plasma processing apparatus as described in, e.g., PCT Publication No. WO2013/132591.

Figure 7:
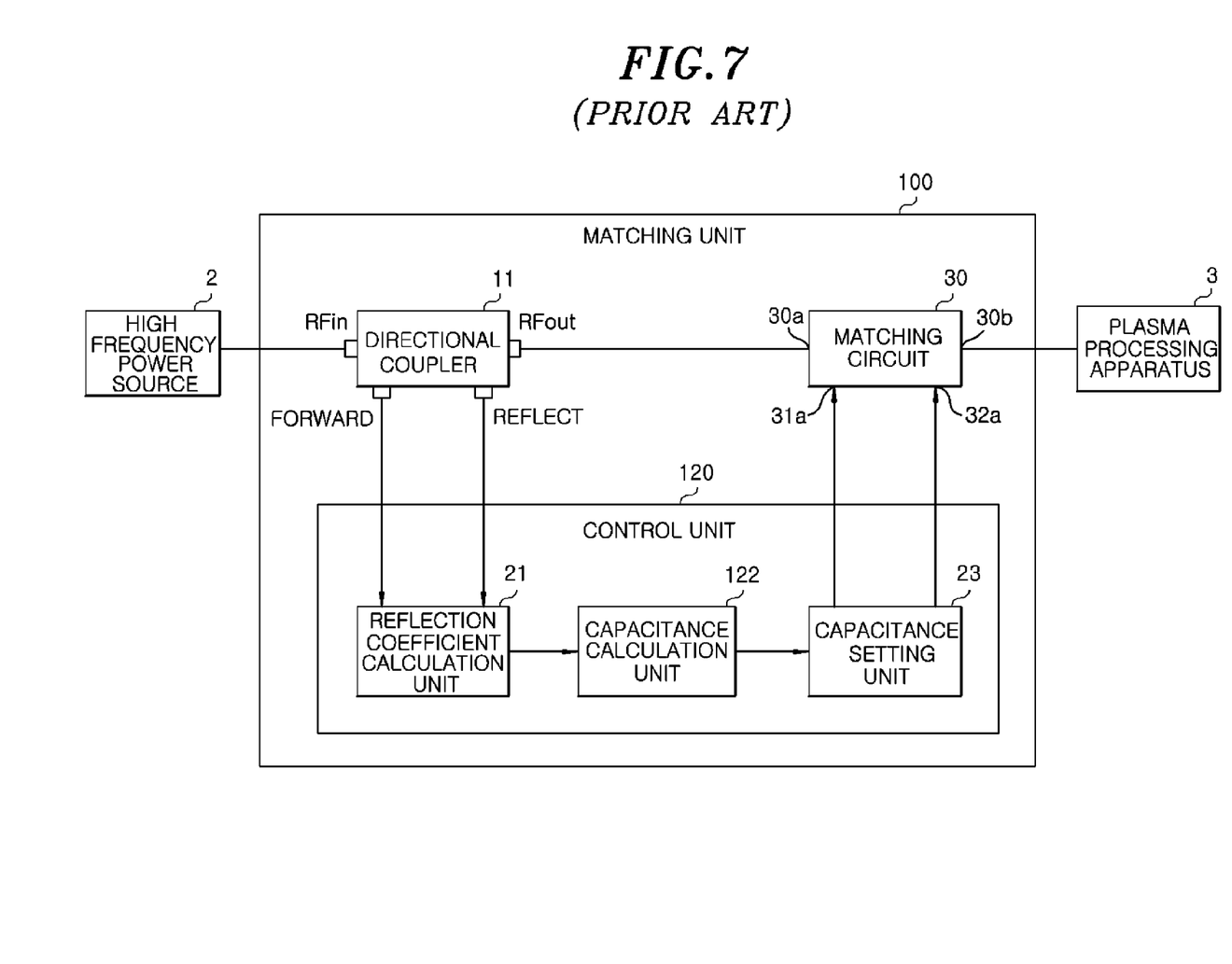
FIG. 7 is a block diagram of a conventional matching unit.

FIG. 7 is a functional block diagram of a conventional matching unit 100. In FIG. 7, the matching unit 100 is provided between a high frequency power source 2 and a plasma processing apparatus 3. A plasma is generated in the plasma processing apparatus 3 by supplying a high frequency power outputted from the high frequency power source 2 to the plasma processing apparatus 3 via the matching unit 100. In order to efficiently supply the power from the high frequency power source 2 to the plasma processing apparatus 3, an impedance needs to be matched between the high frequency power source 2 and the plasma processing apparatus 3. An output impedance of the high frequency power source 2 is generally 50Ω. Therefore, it is preferable to set an input impedance of the matching unit 100 to 50Ω by converting an input impedance of the plasma processing apparatus 3 with the matching unit 100.

The input impedance of the plasma processing apparatus 3 varies depending on types, flow rates, pressures and temperatures of gases to be supplied to the plasma processing apparatus 3. Accordingly, the matching unit 100 needs to perform adaptive matching in response to the temporally varying input impedance of the plasma processing apparatus 3.

The matching unit 100 shown in FIG. 7 includes a directional coupler 11 for detecting a travelling wave and a reflected wave, a matching circuit 30 having a matching device for matching an impedance between the high frequency power source 2 and the plasma processing apparatus 3, and a control unit 120 for controlling a circuit constant of the matching device of the matching circuit 30.

Hereinafter, an operation of the directional coupler 11 will be described.

A high frequency power (travelling wave: Pf) travelling from an RFin terminal toward an RFout terminal is detected by the directional coupler 11 and outputted to a FORWARD terminal.

A high frequency power (reflected wave: Pr) traveling from the RFout terminal toward the RFin terminal is detected by the directional coupler 11 and outputted to a REFLECT terminal. The high frequency power travelling from the RFin terminal toward the RFout terminal is not detected at the REFLECT terminal, or if detected, the amount thereof is very small. Similarly, the high frequency power Pr travelling from the RFout terminal toward the RFin terminal is not detected at the FORWARD terminal, or if detected, the amount thereof is very small.

The travelling wave Pf and the reflected wave Pr detected by the directional coupler 11 are inputted into a reflection coefficient calculation unit 21 of the control unit 120. A reflection coefficient $\Gamma$ is defined from an amplitude ratio r of the reflected wave Pr to the traveling wave Pf and a phase difference $\theta$ therebetween, as in the following Eq. (1).

$$\Gamma = r \cdot \exp(j \cdot \theta) \quad (j: \text{imaginary unit}) \quad \text{Eq. (1)}$$

The reflection coefficient $\Gamma$ can be obtained as long as the amplitude ratio r of the reflected wave Pr to the traveling wave Pf and the phase difference therebetween can be obtained. The reflection coefficient calculation unit 21 calculates the reflection coefficient $\Gamma$ by obtaining the amplitude ratio r and the phase difference $\theta$ based on the traveling wave Pf and the reflected wave Pr. Specifically, the traveling wave Pf and the reflected wave Pr are transformed to the frequency domain by FFT (Fast Fourier Transform). The amplitude ratio r and the phase difference $\theta$ are calculated by comparing the amplitudes and the phases of the traveling wave Pf and the reflected wave Pr at a frequency equal to that of the high frequency power outputted from the high frequency power source 2.

A capacitance calculation unit 122 calculates a capacitance that makes the reflection coefficient $\Gamma$ close to zero based on the reflection coefficient $\Gamma$ calculated by the reflection coefficient calculation unit 21. The calculation of the capacitance will be described later. A capacitance setting unit 23 sets and changes a capacitance of a variable capacitance capacitor in the matching circuit 30 based on the capacitance calculated by the capacitance calculation unit 122.

Figure 2:
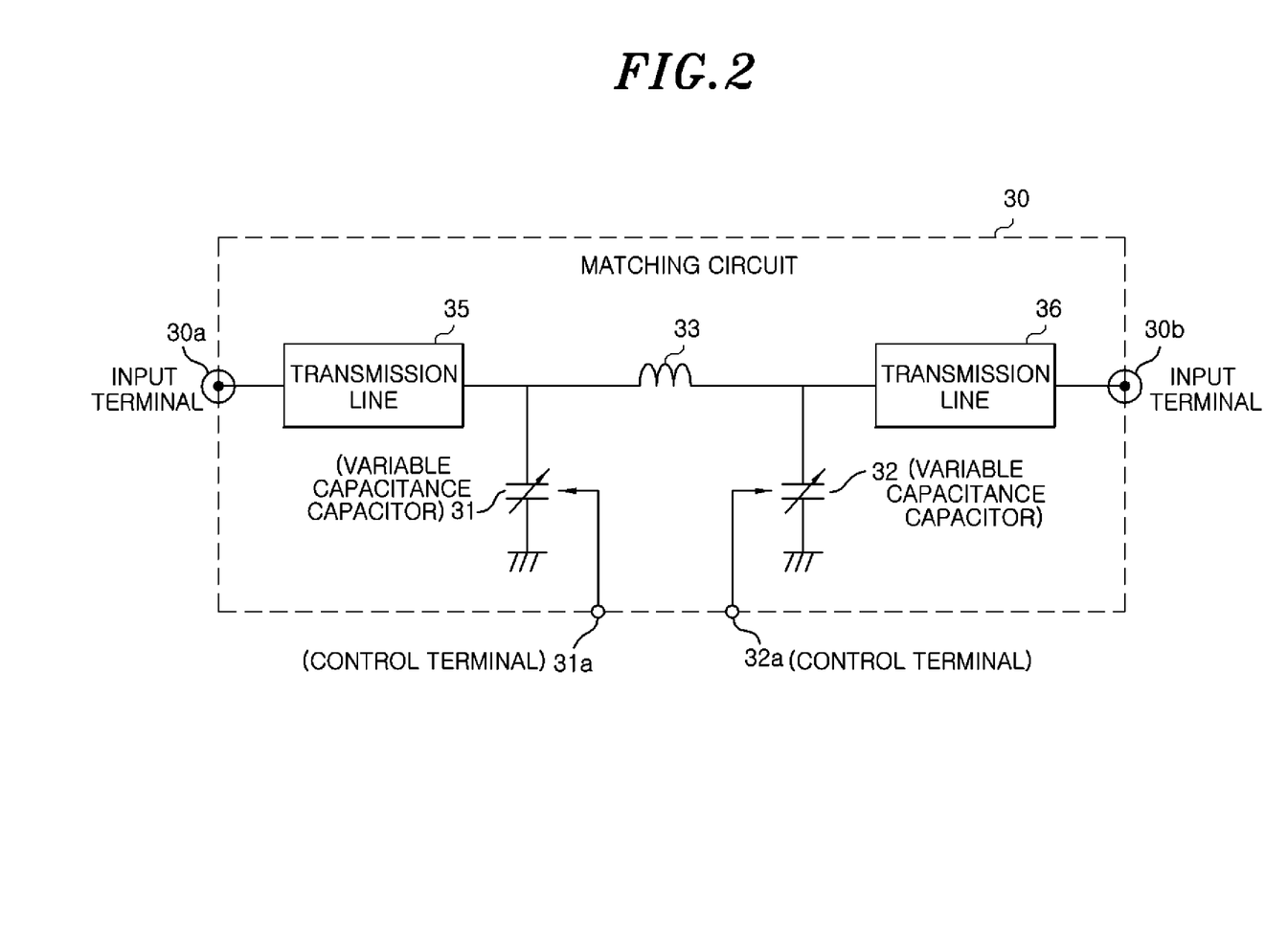
FIG. 2 is a block diagram of a matching circuit according to the embodiment.

FIG. 2 is a block diagram of the matching unit 30.

A circuit configuration of the matching circuit 30 is determined by a variation range of the input impedance of the plasma processing apparatus 3 which acts as a load. In this case, a π-type matching circuit will be described as an example. The matching circuit 30 is configured to include variable capacitance capacitors 31 and 32, an inductance, and transmission lines 35 and 36. The transmission lines 35 and 36 may be configured as coaxial cables, metal plates or the like and may include a lumped constant circuit of a capacitor or an inductor.

An input terminal 30a of the matching circuit 30 and one end of the variable capacitance capacitor 31 are connected through the transmission line 35. The other end of the variable capacitance capacitor 31 is grounded. An output terminal 30b of the matching circuit 30 and one end of the variable capacitance capacitor 32 are connected through the transmission line 36. The other end of the variable capacitance capacitor 32 is grounded.

The variable capacitance capacitors 31 and 32, and the inductance 33 serve as matching devices for matching an impedance between the high frequency power supply 2 and the plasma processing apparatus 3. The matching circuit 30 further includes a variable capacitance capacitor control terminal 31a for controlling a capacitance of the variable capacitance capacitor 31 and a variable capacitance capacitor control terminal 32a for controlling a capacitance of the variable capacitance capacitor 32.

The variable capacitance capacitor of the matching circuit 30 is controlled such that the reflection coefficient $\Gamma$ calculated from the travelling wave Pf and the reflected wave Pr detected by the directional coupler 11 becomes close to zero. The calculation of the variable capacitance at this time will be described in the following Eqs. (2) and (3). VC1 indicates a capacitance of the variable capacitance capacitor 31. VC2 indicates a capacitance of the variable capacitance capacitor 32.

$$VC1(n)=VC1(n-1)+\text{real}(\Gamma(n))*S1 \quad \text{Eq. (2)}$$

$$VC2(n)=VC2(n-1)-\text{imag}(\Gamma(n))*S2 \quad \text{Eq. (3)}$$

Here, real( ) indicates a real part of a complex number in parentheses, and imag( ) indicates an imaginary part of a complex number in parentheses. S1 and S2 indicate coefficients and determine an update amount of the capacitance.

The above Eq. (2) is used for updating VC1. The above Eq. (3) is used for updating VC2. VC1 ($n$) is calculated by adding a value obtained by multiplying the real part of the reflection coefficient $\Gamma$ by the coefficient S1 to a previously updated VC1 ($n-1$). VC2 ($n$) is calculated by subtracting a value obtained by multiplying the imaginary part of the reflection coefficient $\Gamma$ by the coefficient S2 from a previously updated VC2 ($n-1$). Here, in VC1 and VC2, whether the update amount (real ($\Gamma$)*S1 or imag ($\Gamma$)*S2) is added or subtracted depends on the circuit type of the matching circuit 30 and the input impedance of the load to be matched.

The algorithm of such a conventional technique is disadvantageous in that VC1 and VC2 do not converge on a matching point when the load impedance changes. As described above, the impedance of the plasma load changes. The impedance of the plasma load changes abruptly before and after the ignition of the plasma and also changes depending on types, flow rates, pressures and temperatures of gases to be supplied to the plasma processing apparatus.

VC1 and VC2 for allowing the input impedance of the matching circuit 30 to be matched to 50Ω (i.e., for making the reflection coefficient zero) are determined by the load impedance connected to the output of the matching unit 100. Since, however, the plasma load changes, VC1 and VC2 for the matching also change. Accordingly, in the case of using the algorithm of the above Eqs. (2) and (3), VC1 and VC2 may not converge on the matching point. This is because VC1 is calculated by the above Eq. (2) and VC2 is calculated by the above Eq. (3). In other words, VC1 is calculated from the real part of the reflection coefficient and VC2 is calculated from the imaginary part of the reflection coefficient. However, the relationship of the above Eqs. (2) and (3) may not be satisfied depending on the impedance of the plasma load or the capacitance of the variable capacitance capacitor. In that case, VC1 and VC2 do not converge on the matching point.

SUMMARY OF THE INVENTION

As described above, in the matching algorithm of the conventional technique, there may be no convergence on a matching point depending on the load impedance. In view of the above, the present invention provides a matching algorithm that converges on a matching point regardless of the load impedance.

In accordance with an aspect, there is provided a matching unit including: directional coupler configured to detect a travelling wave and a reflected wave; a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and a control unit configured to control a capacitance value of the first variable capacitance capacitor and a capacitance value of the second variable capacitance capacitor based on the travelling wave and the reflected wave detected by the directional coupler.

The control unit calculates a reflection coefficient based on the travelling wave and the reflected wave detected by the directional coupler.

When a distance between the calculated reflection coefficient and a circle described by a trace of the reflection coefficient which passes through a matching point on a Smith chart is greater than a predetermined value, the control unit changes the capacitance value of the second variable capacitance capacitor and the calculated reflection coefficient to make the distance equal to or less than the predetermined value, and when the distance becomes equal to or less than the predetermined value, the control unit changes the capacitance value of the first variable capacitance capacitor and makes the calculated reflection coefficient smaller.

With the above configuration, the matching algorithm of the present invention can converge on the matching point regardless of the load impedance.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
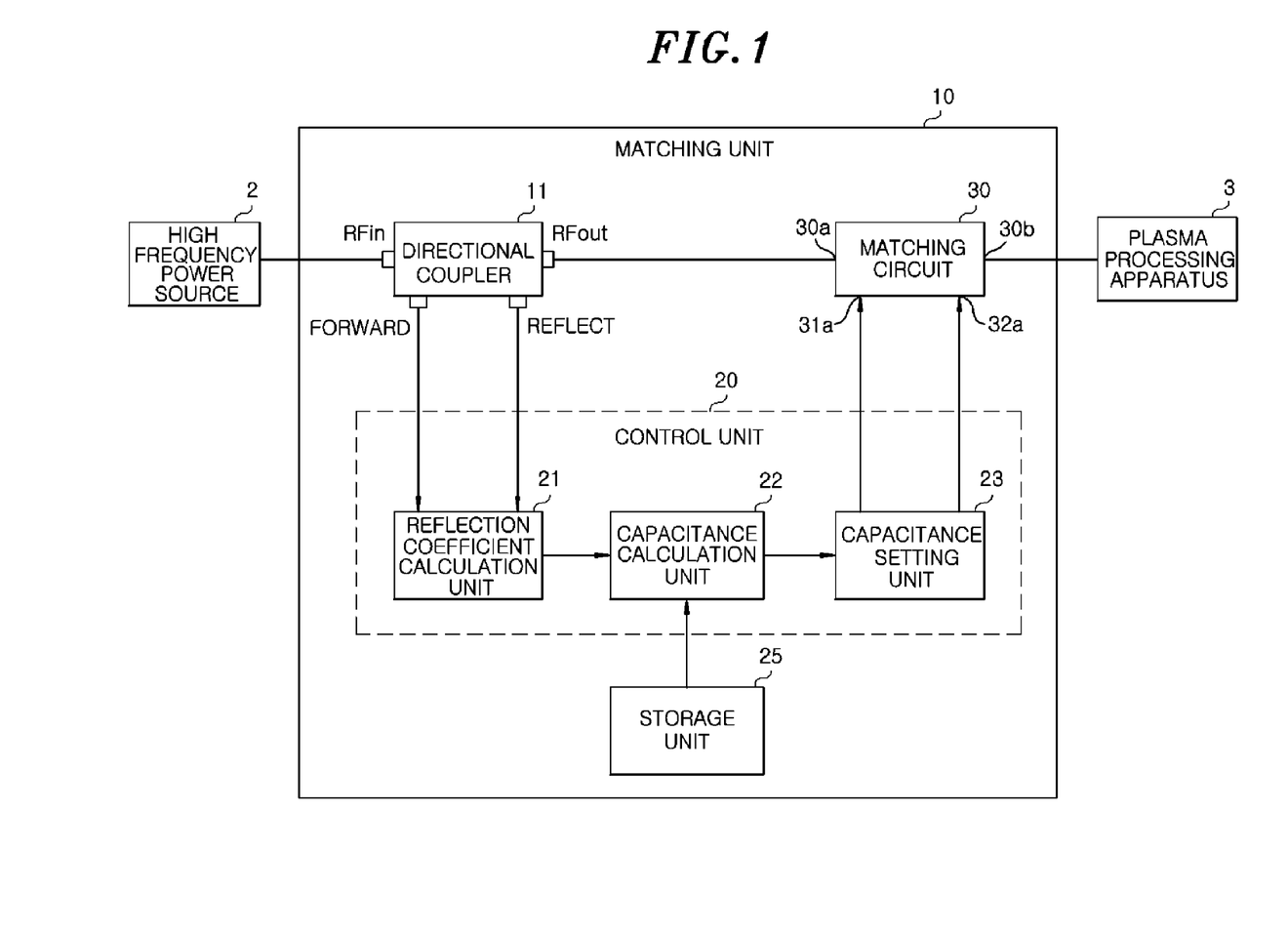
FIG. 1 is a block diagram of a matching unit according to an embodiment.

Hereinafter, embodiments will be described with reference to the accompanying drawings. FIG. 1 is a block diagram of a matching unit 10 according to an embodiment. Like reference numerals used in FIGS. 1 and 7 designate like parts, and redundant description thereof will be omitted.

The matching unit 10 is configured to include a directional coupler 11 for detecting a travelling wave and a reflected wave, a matching circuit 30 having a matching device for matching an impedance between a high frequency power source 2 and a plasma processing apparatus 3, a control unit 20 for controlling a circuit constant of the matching device of the matching unit 10, and a storage unit 25.

As described with reference to FIG. 2, the matching circuit 30 includes the input terminal 30a, the output terminal 30b, the first variable capacitance capacitor 31 having one end connected to the input terminal 30a through the transmission line 35 and the other end that is grounded, the second variable capacitance capacitor 32 having one end connected to the output terminal 30*b* through the transmission line 36 and the other end that is grounded, and the inductance 33 having one end connected to the one end of the first variable capacitance capacitor 31 and the other end connected to the one end of the second variable capacitance capacitor 32.

The control unit 20 is configured to include the reflection coefficient calculation unit 21, the capacitance calculation unit 22, and the capacitance setting unit 23. As described above, the control unit 20 calculates a reflection coefficient based on the travelling wave and the reflected wave detected by the directional coupler 11 and controls a capacitance value of the first variable capacitance capacitor 31 and a capacitance value of the second variable capacitance capacitor 32 by using the reflection coefficient thus calculated. The storage unit 25 stores information on a circle or the like which will be described later.

The matching unit 10 is different from the conventional matching unit 100 in the processing of the capacitance calculation unit 22, i.e., the control of the capacitance value VC1 of the variable capacitance capacitor 31 and the capacitance value VC2 of the variable capacitance capacitor 32 of the matching circuit 30. Further, the matching unit 10 is different from the conventional matching unit 100 in that the storage unit 25 storing information on a circle is provided. The other configurations are the same as those of the conventional matching unit 100.

The information on a circle is the information on a position or a size of a circle described by a trace of the reflection coefficient Γ which passes through a matching point (where the real part and the imaginary part of the reflection coefficient Γ are zero) of a Smith chart. It is known that the information on a circle is determined based on conditions of the transmission line 35, i.e., a characteristic impedance $Z_L$ and a line length L of the transmission line 35.

The capacitance calculation unit 22 calculates the capacitance values VC1 and VC2 of the variable capacitance capacitors 31 and 32 of the matching unit 30 which correspond to the calculated reflection coefficient Γ based on the information on a circle which is stored in the storage unit 25 and the reflection coefficient Γ calculated by the reflection coefficient calculation unit 21. In other words, the capacitance calculation unit 22 calculates the capacitance values VC1 and VC2 that make the reflection coefficient Γ smaller.

Specifically, the capacitance calculation unit 22 calculates the capacitance value VC2 of the variable capacitance capacitor 32 of the matching circuit 30 such that the reflection coefficient Γ calculated by the reflection coefficient calculation unit 21 becomes close to the circle stored in the storage unit 25. The capacitance setting unit 23 changes the capacitance value VC2 of the variable capacitance capacitor 32 to the calculated capacitance value. Accordingly, the reflection coefficient Γ is positioned on the circle by the capacitance setting unit 23.

Next, the capacitance calculation unit 22 calculates the capacitance value VC1 of the variable capacitance capacitor 31 of the matching circuit 30 such that the reflection coefficient Γ calculated by the reflection coefficient calculation unit 21 becomes smaller. The capacitance setting unit 23 changes the capacitance value VC1 of the variable capacitance capacitor 31 to the calculated capacitance value. Accordingly, the reflection coefficient Γ is positioned on the matching point (where the reflection coefficient Γ is zero) by the capacitance setting unit 23.

The information on a circle determined by the transmission line 35 has been previously stored in the storage unit 25. As described above, the information on a circle (position and size) is determined based on the condition of the transmission line 35, i.e., the characteristic impedance $Z_L$ and the line length L of the transmission line 35. For example, when the transmission line 35 is short enough to be ignored, a circle R1 shown in FIG. 3 to be described later is drawn. When the transmission line 35 has a characteristic impedance of 50Ω and a line length of λ/4, a circle R2 shown in FIG. 4 or a circle R3 shown in FIG. 5 which will be described later is drawn.

Hereinafter, the principle of the matching algorithm of the present embodiment will be described.

At a certain plasma load, when the impedance between the high frequency power source 2 and the plasma processing apparatus 3 is matched (i.e., when the reflection coefficient Γ is zero), the values of VC1 and VC2 are set to X and Y, respectively. For better understanding, a trace of the input impedance of the matching circuit 30, i.e., the trace of the reflection coefficient Γ, in the case of changing the value of VC1 from the matching condition in which VC1 is X and VC2 is Y, is shown on the Smith chart of FIG. 3. In this case, the transmission line 35 is short enough to be ignored compared to the wavelength λ of the travelling wave and the reflected wave.

Figure 3:
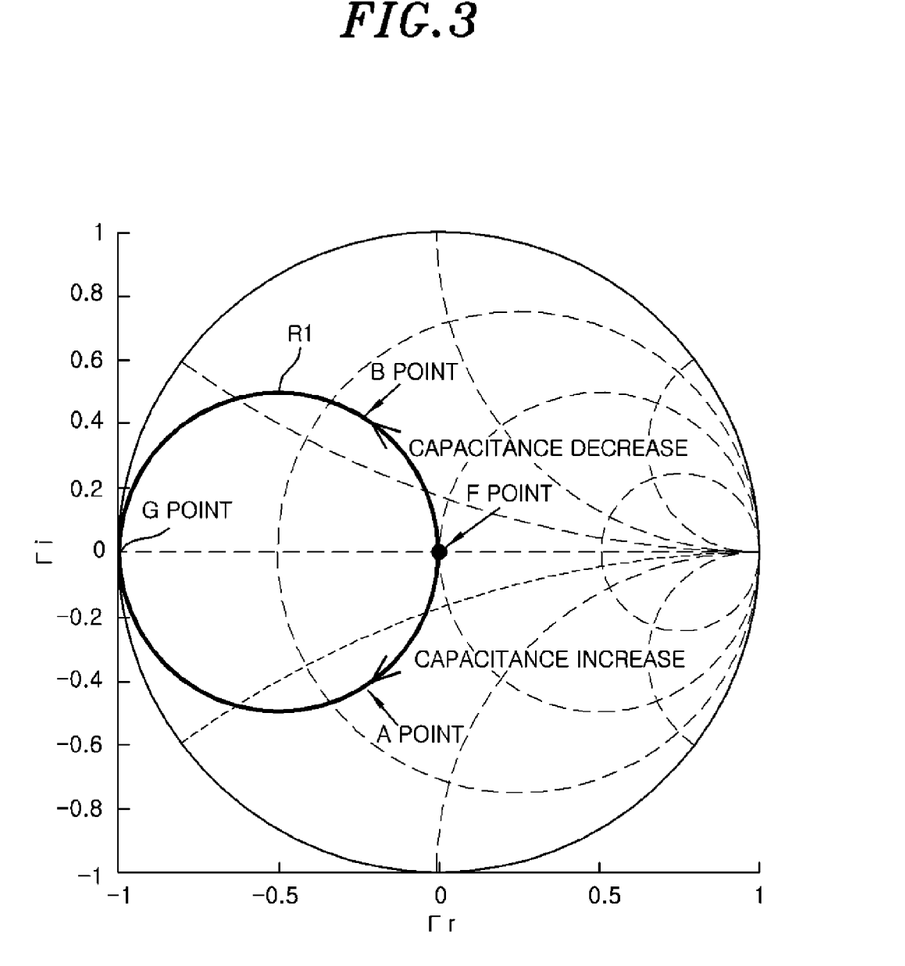
FIG. 3 explains an example of a reflection coefficient trace in the case of changing a capacitance of a variable capacitance capacitor.

In FIG. 3, when the VC1 is changed, the trace of the reflection coefficient Γ describes the circle R1 having as a diameter a segment connecting G point and F point where the matching is realized. The reflection coefficient Γ at the F point has an imaginary part (Γi) of zero and a real part (Γi) of zero (the input impedance of the matching unit 10 is 50Ω). The reflection coefficient Γ at the G point has an imaginary part of zero and a real part of −1.

Specifically, in FIG. 3, when the value of VC1 is increased in a state where the matching is realized (F point), the reflection coefficient Γ moves on the circle R1 from the F point toward A point. When the value of VC1 is decreased, the reflection coefficient Γ moves on the circle R1 from the F point toward a B point. This is known as an impedance trace obtained when the variable capacitance capacitor 31 is connected to the ground (grounded) in the π-type matching circuit 30 shown in FIG. 2 which includes the variable capacitance capacitors 31 and 32 and the inductance 33. Thus, detailed description thereof will be omitted.

Figure 4:
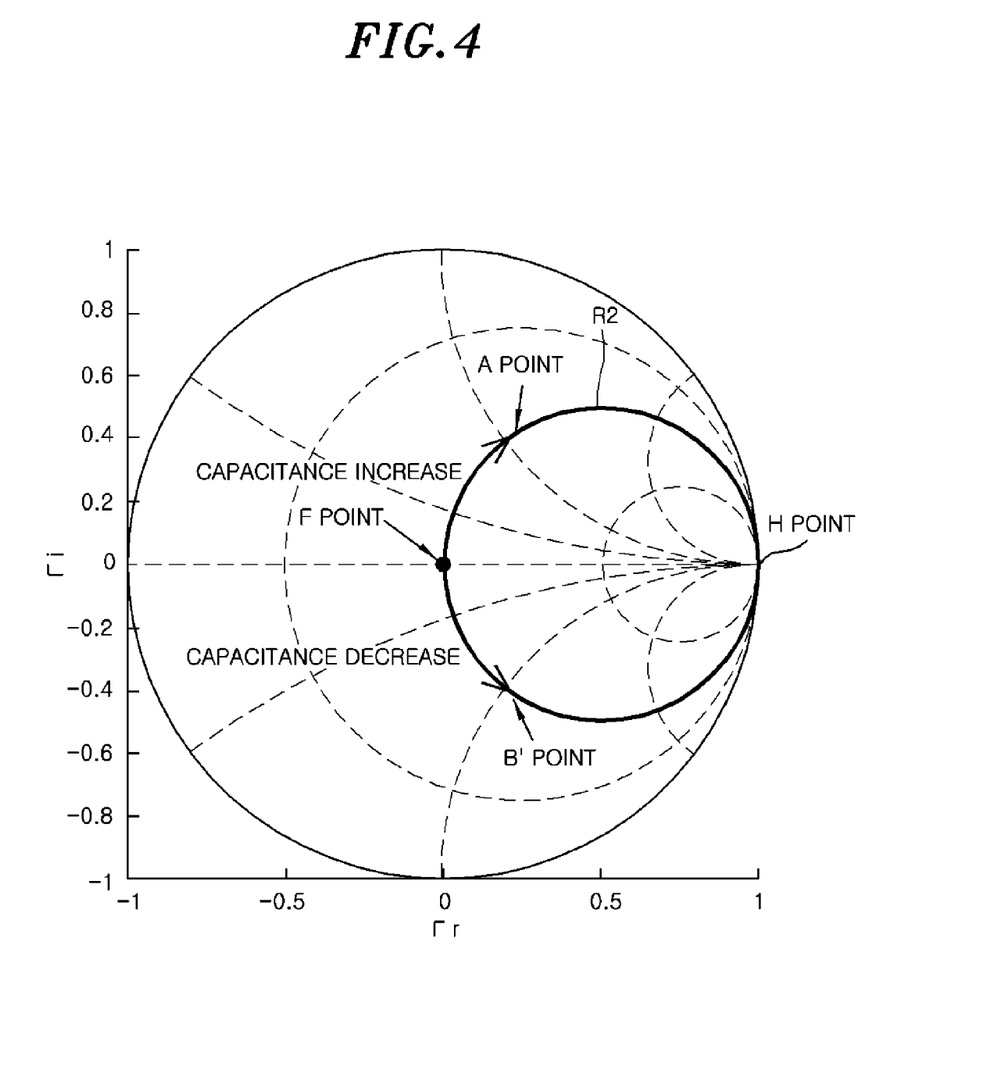
FIG. 4 explains another example of the reflection coefficient trace in the case of changing a capacitance of a variable capacitance capacitor.

FIG. 3 shows the case in which the transmission line 35 may be ignored. However, the transmission line 35 may not be ignored actually. FIG. 4 shows a trace of the reflection coefficient Γ on the Smith chart which is obtained when the transmission line 35 has a characteristic impedance of 50Ω and a line length of λ/4. In FIG. 4, the trace of the reflection coefficient Γ draws a circle R2 having as a diameter a segment connecting H point and the F point where the matching is realized. The reflection coefficient Γ at the H point has an imaginary part of zero and a real part of 1 (the input impedance of the matching unit 10 is infinite).

In the matching circuit 30 of FIG. 2, it is assumed that an input impedance seen from a right end of the transmission line 35 is $Z_1$ and an input impedance seen from a left end of the transmission line 35 is $Z_2$. $Z_2$ is defined by the following Eq. (4). In the following Eq. (4), $Z_1$ indicates the input impedance in the case where the transmission line 35 may be ignored (FIG. 3) and $Z_2$ indicates the input impedance in the case where the transmission line 35 may not be ignored (FIG. 4). When the transmission line 35 may not be ignored (FIG. 4), the circle R1 shown in FIG. 3 is changed to the circle R2 shown in FIG. 4.

$$Z_2 = Z_L \frac{Z_1 + jZ_L \tan\left(\frac{2\pi}{\lambda}L\right)}{Z_L + jZ_1 \tan\left(\frac{2\pi}{\lambda}L\right)} \qquad \text{Eq. (4)}$$

In the case of inserting the transmission line 35 having a characteristic impedance of 50Ω and a line length of λ/4, the trace shown in FIG. 3 is changed to the trace shown in FIG. 4 by 180° rotation about the point (F point) where the real part and the imaginary part of the reflection coefficient Γ are zero. Therefore, in FIG. 4, when the value of VC1 is increased in a state where the matching is realized (F point), the reflection coefficient Γ moves on the circle R2 toward A' point (direction in which the imaginary part of the reflection coefficient Γ is positive). When the value of VC1 is decreased, the reflection coefficient Γ moves on the circle R2 toward B' point (direction in which the imaginary part of the reflection coefficient Γ is negative). In other words, on the circle R2 shown in FIG. 4, when the imaginary part of the reflection coefficient Γ is positive, VC1 is greater than the matching value X, whereas when the imaginary part of the reflection coefficient Γ is negative, VC1 is smaller than the matching value X.

In FIG. 4, when VC1 is increased or decreased at the matching point (F point), the reflection coefficient Γ follows the trace of the circle R2. This indicates that the reflection coefficient Γ moves on the circle R2 shown in FIG. 4 when VC1 is changed in a state where VC2 is set to the matching value. Therefore, it is preferable that after VC2 is first controlled such that the reflection coefficient Γ is positioned on the circle R2 shown in FIG. 4, VC1 is controlled such that the reflection coefficient Γ becomes zero.

Figure 5:
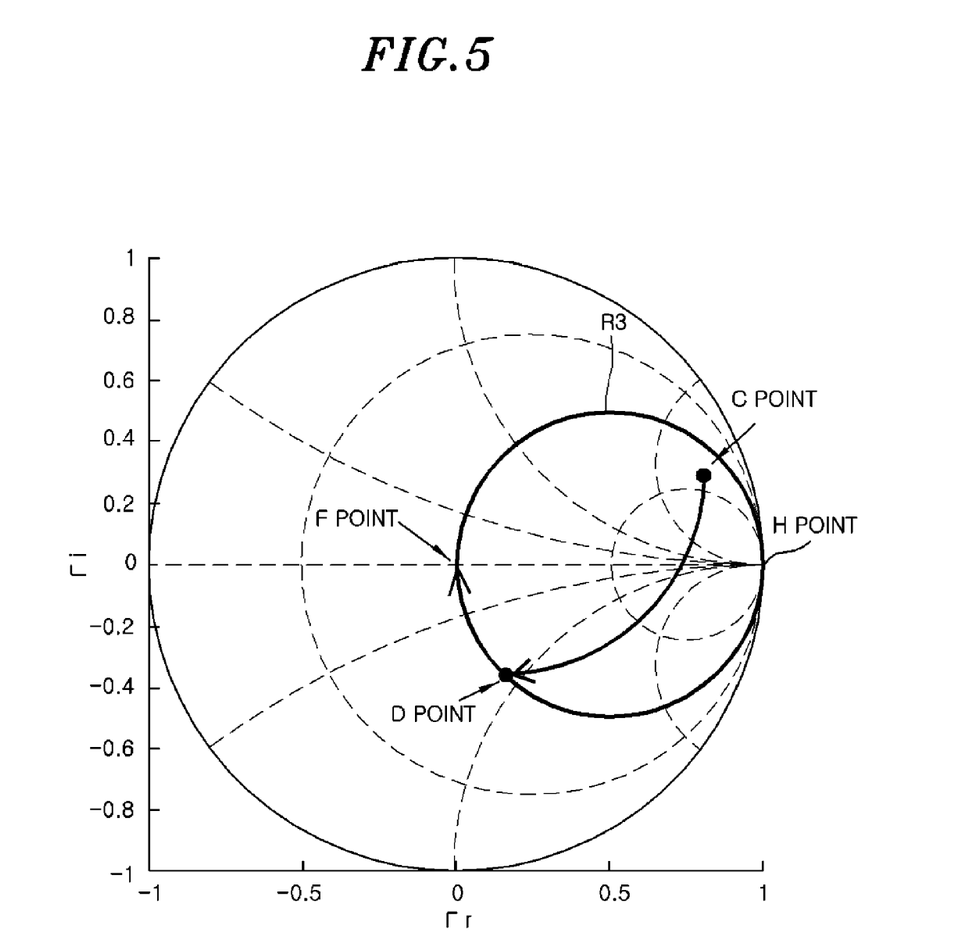
FIG. 5 shows a reflection coefficient trace according to the embodiment.

FIG. 5 shows a trace of the reflection coefficient Γ on a Smith chart in the case of performing the impedance matching according to the embodiment by the matching unit 30 under the condition that the transmission line 35 has a characteristic impedance of 50Ω and a line length of λ/4 as in the case shown in FIG. 4. C point is the reflection coefficient Γ, i.e., the input impedance of the matching unit 10, at the time when VC1 and VC2 are initial values (e.g., the minimum value of the variable capacitance capacitor), in a case where the plasma load has a certain input impedance.

First, the control unit 20 increases only VC2 until the reflection coefficient Γ reaches from the C point where VC1 and VC2 are the initial values to D point on the circle R3. The circle R3 is the same as the circle R2 shown in FIG. 4. The information on the circle R3 is stored in the storage unit 25. When the reflection coefficient Γ reaches the D point on the circle R3, the VC2 becomes the matching capacitance Y. In that state, VC2 is controlled to the matching value, whereas VC1 remains at the initial value. Then, the control unit 20 gradually increases VC1. When the VC1 is increased, the reflection coefficient Γ moves on the circle R3 as described above. Accordingly, it is preferable to stop the increase of VC1 when the reflection coefficient Γ becomes zero. At this time, the VC1 becomes the matching capacitance X.

The trace shown in FIG. 5 is an example of the case in which an input impedance of the plasma load is a certain value. When the input impedance of the plasma load is changed, the positions of the C point and the D point are changed. However, when VC2 is the matching capacitance, the reflection coefficient Γ is positioned on the circle R3.

In the case of the C point shown in FIG. 5, a minimum value of the variable capacitance capacitor is selected as the initial values of VC1 and VC2; however, a maximum value of the variable capacitance capacitor or another value may be selected. In that case, the position of the C point is changed. However, regardless of the initial values of VC1 and VC2, when the VC1 is changed in a state where the VC2 is the matching capacitance, the reflection coefficient Γ moves on the circle R3.

Therefore, the control unit 20 controls only the VC2 until the reflection coefficient Γ is positioned on the circle R3 and then controls only the VC1 after the reflection coefficient Γ is positioned on the circle R3. In the control of the VC2, the reflection coefficient Γ is outside the circle R3 if the VC2 is greater than the matching value Y and, thus, the VC2 is decreased so that the reflection coefficient Γ is positioned on the circle R3. On the contrary, the reflection coefficient Γ is inside the circle R3 if the VC2 is smaller than the matching value Y and, thus, the VC2 is increased so that the reflection coefficient Γ is positioned on the circle R3.

After the VC2 is controlled so that the reflection coefficient Γ is positioned on the circle R3, the VC1 is controlled in the following manner. Specifically, when the imaginary part of the reflection coefficient Γ is positive, the VC1 is greater than the matching value X and, thus, the VC1 is decreased so that the reflection coefficient Γ becomes zero. On the contrary, when the imaginary part of the reflection coefficient Γ is negative, the VC1 is smaller than the matching value X and, thus, the VC1 is increased so that the reflection coefficient Γ becomes zero.

Even when the input impedance of the plasma load is changed during the control of the VC1 and the VC2, the VC2 and the VC1 are controlled as described above. Specifically, the VC2 is controlled so that the reflection coefficient Γ is positioned on the circle R3 and, then, the VC1 is controlled.

FIGS. 4 and 5 show as an example the case in which the transmission line 35 has a characteristic impedance of 50Ω and a line length of λ/4 in the matching circuit 30 of FIG. 2. However, the present invention is not limited thereto. If the condition of the transmission line 35 is different from the above condition, the trace of the circle in the case of changing the VC1 under the condition in which the VC2 is the matching capacitance is different from the trace of the circle R3 shown in FIGS. 4 and 5. Therefore, the trace of the circle which satisfies the condition of the transmission line 35 may be set by the above-described Eq. (4).

Figure 6:
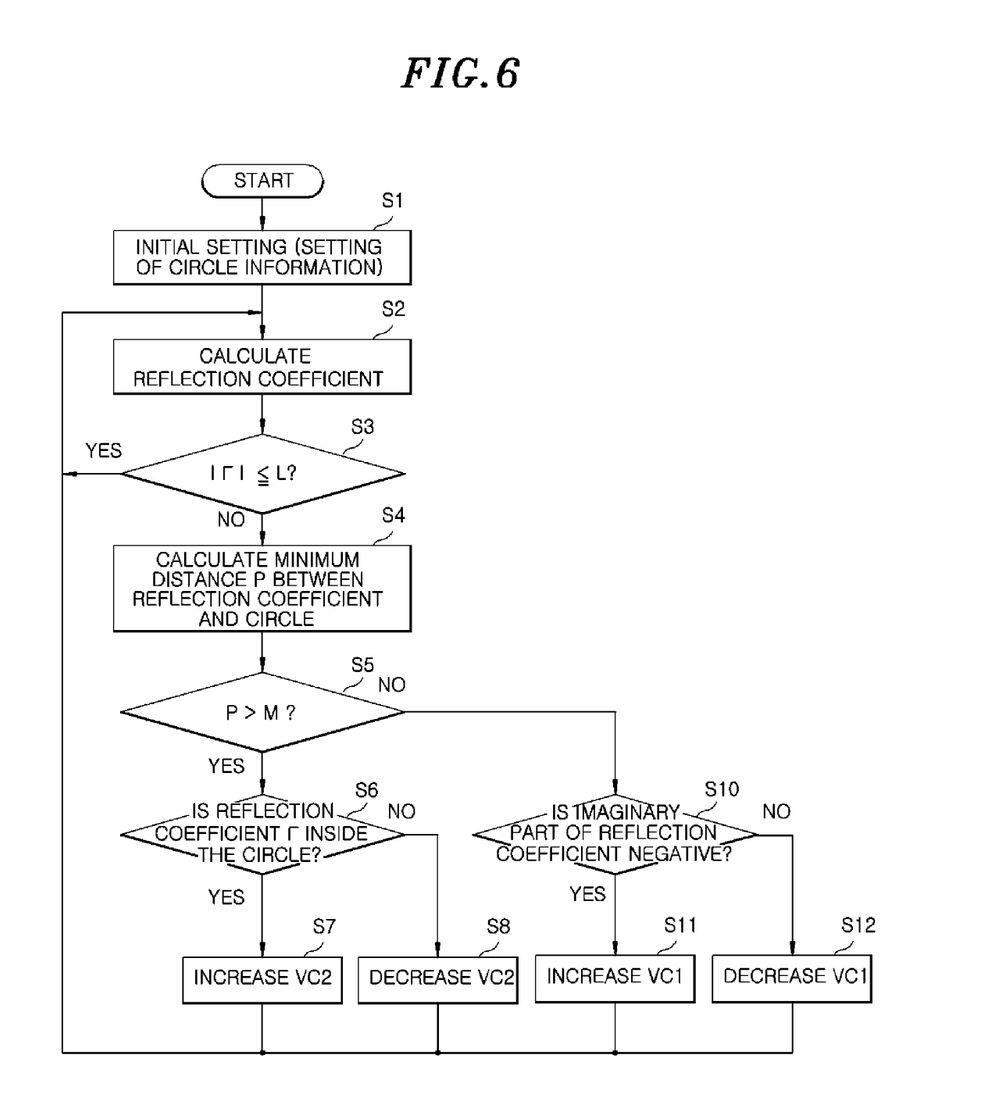
FIG. 6 is a flowchart of an impedance matching process according to the embodiment.

FIG. 6 is a flowchart of an impedance matching process according to an embodiment. This process is performed by the control unit 20.

First, as initial setting, the information on the circle shown in FIGS. 4 and 5 (size and position on the Smith chart) is stored in the storage unit 25 (step S1 of FIG. 6). Since the information on the circle is determined by the transmission line 35 as described above, the information on the matching circuit 30 is also required. In the step S1, the initial values of VC1 and VC2 are also set.

Next, the reflection coefficient Γ at that time is calculated from the travelling wave Pf and the reflected wave Pr detected by the directional coupler 11 (step S2). Then, an absolute value of the reflection coefficient Γ and a predetermined value L are compared (step S3). When the absolute value of the reflection coefficient Γ is smaller than or equal to L (Yes in the step S3), the process returns to the step S2 to obtain the travelling wave Pf and the reflected wave Pr from the directional coupler 11 and calculate again the reflection coefficient Γ at that time.

When the absolute value of the reflection coefficient Γ is greater than L (No in step S3), the process proceeds to a step S4. The predetermined value L is a threshold value for determining whether or not the matching is realized. The predetermined value L is ideally zero, but a certain threshold value L is used because it is actually difficult to make the reflection coefficient Γ zero. The predetermined value L is determined by a reflection-resistant power of the high frequency power source 2 and specifications of the plasma processing apparatus 1 using the high frequency power source 2.

In the step S4, in order to determine whether or not the reflection coefficient Γ is positioned on the circle defined by the initial setting (step S1), the information on the circle is acquired from the storage unit 25 and a minimum value P of the distance between the reflection coefficient Γ and the circle is calculated. When the value P is greater than a predetermined threshold value M (Yes in step S5), the VC2 is not the matching value and thus is controlled to be changed. Specifically, it is determined that the reflection coefficient Γ is not positioned on the circle and the process proceeds to a step S6. The predetermined threshold value M is ideally zero but set to a certain value because it is actually difficult to set the predetermined threshold value M to zero.

When the minimum value P is smaller than or equal to the predetermined threshold value M (No in step S5), VC2 is the matching value and there is no need to change VC2. Therefore, the process proceeds to an operation of controlling the VC1 (i.e., the variable capacitance capacitor 31). In other words, it is determined that the reflection coefficient Γ is positioned on the circle and the process proceeds to a step S10.

In the step S6, it is determined whether or not the reflection coefficient Γ is inside the circle to decide whether to increase or decrease the VC2 (i.e., the capacitance of the variable capacitance capacitor 32). When the reflection coefficient Γ is inside the circle (Yes in the step S6), the VC2 is smaller than Y and thus is increased (step S7). When the reflection coefficient Γ is outside the circle (No in step S6), the VC2 is greater than Y and thus is decreased (step S8). The amount of increase and decrease may be set in advance.

By repeating the processes from the step S2 to the step S7 or S8, the minimum value P can be smaller than or equal to the predetermined threshold value M. In other words, the reflection coefficient Γ can be positioned substantially on the circle. When it is determined in the step S5 that the minimum value P is smaller than or equal to the predetermined threshold value M, the process proceeds to the step S10 to perform the operation of controlling the VC1 (i.e., the variable capacitance capacitor 31).

In the step S10, it is determined whether or not the imaginary part of the reflection coefficient Γ is negative. In other words, it is determined whether or not the VC1 is smaller than X. As described above, when the imaginary part of the reflection coefficient Γ is negative, the VC1 is smaller than X. When the imaginary part of the reflection coefficient Γ is positive, the VC1 is greater than X. Therefore, when the imaginary part of the reflection coefficient Γ is negative (Yes in step S10), the VC1 is increased. When the imaginary part of the reflection coefficient Γ is positive (No in step S10), the VC1 is decreased. By changing the VC1 in the above manner, the reflection coefficient Γ becomes close to zero. The amount of increase and decrease may be set in advance.

As described above, the control unit 20 calculates the reflection coefficient based on the travelling wave and the reflected wave detected by the directional coupler 11. When the distance between the calculated reflection coefficient and the circle described by the trace of the reflection coefficient which passes through the matching point on the Smith chart is greater than a predetermined value, the control unit 20 changes the capacitance value of the second variable capacitance capacitor 32 and the calculated reflection coefficient to make the distance equal to or less than the predetermined value. When the distance becomes equal to or less than the predetermined value, the control unit 20 changes the capacitance value of the first variable capacitance capacitor 31 and makes the calculated reflection coefficient smaller without changing the distance.

The present embodiment has at least the following effects.

(a) When the distance between the calculated reflection coefficient and the circle described by the trace of the reflection coefficient which passes through the matching point on the Smith chart is greater than the predetermined value, the capacitance value of the second variable capacitance capacitor is changed and the calculated reflection coefficient is changed to make the distance equal to or less than the predetermined value. When the distance becomes equal to or less than the predetermined value, the capacitance value of the first variable capacitance capacitor is changed and the calculated reflection coefficient is decreased. As a result, the matching algorithm of the present invention can converge on the matching point regardless of the load impedance.

The present invention is not limited to the above embodiment and may be variously modified without departing from the scope thereof.

In the above embodiment, the information on the circle which corresponds to the transmission line 35 is stored in the storage unit 25 in advance. However, the information on the circle may be calculated by the control unit 20, when necessary, by using the above Eq. (4).

The specification includes at least the following configurations of the present invention.

(First Configuration)

A matching unit including:

a directional coupler configured to detect a travelling wave and a reflected wave;

a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and a control unit configured to control a capacitance value of the first variable capacitance capacitor and a capacitance value of the second variable capacitance capacitor based on the travelling wave and the reflected wave detected by the directional coupler, wherein the control unit calculates a reflection coefficient based on the travelling wave and the reflected wave detected by the directional coupler, and wherein when a distance between the calculated reflection coefficient and a circle described by a trace of the reflection coefficient which passes through a matching point on a Smith chart is greater than a predetermined value, the control unit changes the capacitance value of the second variable capacitance capacitor and the calculated reflection coefficient to make the distance equal to or less than the predetermined value, and when the distance becomes equal to or less than the predetermined value, the control unit changes the capacitance value of the first variable capacitance capacitor and makes the calculated reflection coefficient smaller.

(Second Configuration)

In the matching unit of the first configuration, the automatic control unit increases the capacitance value of the second variable capacitance capacitor when the calculated reflection coefficient is positioned inside the circle and decreases the capacitance value of the second variable capacitance capacitor when the calculated reflection coefficient is positioned outside the circle.

(Third Configuration)

In the matching unit of the first or second configuration, the control unit increases the capacitance value of the first variable capacitance capacitor when an imaginary part of the calculated reflection coefficient is negative and decreases the capacitance value of the first variable capacitance capacitor when the imaginary part of the calculated reflection coefficient is positive.

(Fourth Configuration)

In the matching unit of the first to third configurations, the first transmission line of the matching circuit has a characteristic impedance of 50Ω and a line length of λ/4 (λ is a wavelength of the travelling wave and the reflected wave) or a line length that is short enough to be ignored compared to the travelling wave and the reflected wave.

INDUSTRIAL APPLICABILITY

The present invention is suitable for a plasma generation microwave power source or the like and can be used in a wide frequency range including an ISM band such as 13.56 MHZ, 915 MHz, 2.45 GHZ, 5.8 GHz or the like.

DESCRIPTION OF REFERENCE NUMERALS

2: high frequency power supply
3: plasma processing apparatus
10: matching unit
11: directional coupler
20: control unit
21: reflection coefficient calculation unit
22: capacitance calculation unit
23: capacitance setting unit
25: storage unit
30: matching circuit
30a: input terminal
30b: output terminal
31, 32: variable capacitance capacitor
31a: control terminal
32a: control terminal
33: inductance
35, 36: transmission line
100: matching unit
120: control unit
122: capacitance calculation unit

What is claimed is:

1. A matching unit comprising:
a directional coupler configured to detect a travelling wave and a reflected wave;
a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and
a control unit configured to control a capacitance value of the first variable capacitance capacitor and a capacitance value of the second variable capacitance capacitor based on the travelling wave and the reflected wave detected by the directional coupler,
wherein the control unit calculates a reflection coefficient based on the travelling wave and the reflected wave detected by the directional coupler, and
wherein when a distance between the calculated reflection coefficient and a circle described by a trace of the reflection coefficient which passes through a matching point on a Smith chart is greater than a predetermined value, the control unit changes the capacitance value of the second variable capacitance capacitor and the calculated reflection coefficient to make the distance equal to or less than the predetermined value, and when the distance becomes equal to or less than the predetermined value, the control unit changes the capacitance value of the first variable capacitance capacitor and makes the calculated reflection coefficient smaller.

2. The matching unit of claim 1, wherein the automatic control unit increases the capacitance value of the second variable capacitance capacitor when the calculated reflection coefficient is positioned inside the circle and decreases the capacitance value of the second variable capacitance capacitor when the calculated reflection coefficient is positioned outside the circle.

3. The matching unit of claim 2, wherein the control unit increases the capacitance value of the first variable capacitance capacitor when an imaginary part of the calculated reflection coefficient is negative and decreases the capacitance value of the first variable capacitance capacitor when the imaginary part of the calculated reflection coefficient is positive.

4. The matching unit of claim 2, wherein the first transmission line of the matching circuit has a characteristic impedance of 50Ω and a line length of λ/4 or a line length that is short enough to be ignored compared to the travelling wave and the reflected wave,
wherein λ is a wavelength of the travelling wave and the reflected wave.

5. A matching method in a matching unit including
a directional coupler configured to detect a travelling wave and a reflected wave; and
a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor, the method comprising:
setting a circle described by a trace of a reflection coefficient which passes through a matching point on a Smith chart depending on a condition of the first transmission line;
calculating a reflection coefficient based on the travelling wave and the reflected wave detected by the directional coupler;
changing, when a distance between the calculated reflection coefficient and the circle is greater than a predetermined value, a capacitance value of the second variable capacitance capacitor and the calculated reflection coefficient to make the distance equal to or less than the predetermined value; and changing, when the distance becomes equal or less than the predetermined value, a capacitance value of the first variable capacitance capacitor to make the calculated reflection coefficient close to zero.

* * * * *